(12) United States Patent
Marcoccia et al.

(10) Patent No.: US 11,143,698 B2
(45) Date of Patent: Oct. 12, 2021

(54) METHODS AND APPARATUS FOR OPTICAL TRANSCEIVER CALIBRATION AND TEST

(71) Applicant: Juniper Networks, Inc., Sunnyvale, CA (US)

(72) Inventors: Roberto Marcoccia, San Jose, CA (US); Theodore J. Schmidt, Gilroy, CA (US); George R. Sosnowski, Sunnyvale, CA (US); Christian Malouin, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 396 days.

(21) Appl. No.: 16/039,829

(22) Filed: Jul. 19, 2018

(65) Prior Publication Data

US 2018/0348294 A1    Dec. 6, 2018

Related U.S. Application Data

(63) Continuation of application No. 14/829,536, filed on Aug. 18, 2015, now Pat. No. 10,031,177.

(51) Int. Cl.
*G01R 31/28* (2006.01)
*G01R 31/317* (2006.01)
*H04B 10/07* (2013.01)

(52) U.S. Cl.
CPC ..... *G01R 31/2834* (2013.01); *G01R 31/2889* (2013.01); *G01R 31/31728* (2013.01); *H04B 10/07* (2013.01)

(58) Field of Classification Search
CPC ............ G01R 31/2834; G01R 31/2889; G01R 31/31728; H04B 10/07
See application file for complete search history.

(56) References Cited

U.S. PATENT DOCUMENTS 3,973,118 A * 8/1976 LaMontagne ............. G01J 3/36
250/226
4,544,235 A * 10/1985 Nishida ............... G02B 6/02033
385/145

(Continued)

FOREIGN PATENT DOCUMENTS

CN      102203650 A      9/2011
CN      104395801 A      3/2015

(Continued)

OTHER PUBLICATIONS

Extended European Search Report for European patent application No. 16155860.6, dated Jan. 2, 2017, 7 pages.

(Continued)

*Primary Examiner* — Daniel R Miller
(74) *Attorney, Agent, or Firm* — Cooley LLP

(57) ABSTRACT

In some embodiments, an apparatus includes an automatic integrated circuit (IC) handler having a change kit. The change kit has a plunger moveably disposable onto an automatic test equipment (ATE). In such embodiments, the ATE is configured to receive an integrated circuit having an optical interface. The plunger has a first position and a second position. In such embodiments, the plunger is out of contact with the integrated circuit when the plunger is in the first position. The plunger includes an optical connector operatively coupled to the optical interface of the integrated circuit when the plunger is in the second position.

18 Claims, 4 Drawing Sheets

(56) References Cited

U.S. PATENT DOCUMENTS

| | | | | |
|---|---|---|---|---|
| 4,556,314 A | * | 12/1985 | Stone | G01M 11/333 356/73.1 |
| 5,129,022 A | * | 7/1992 | Marcus | G01D 5/268 385/47 |
| 5,502,785 A | * | 3/1996 | Wang | G02B 6/42 385/31 |
| 5,686,833 A | | 11/1997 | Spinner | |
| 6,008,487 A | * | 12/1999 | Tachikawa | G01M 11/3172 250/227.12 |
| 6,297,654 B1 | | 10/2001 | Barabi | |
| 6,362,476 B1 | * | 3/2002 | Strelchun | G01J 3/12 250/339.09 |
| 6,587,261 B1 | * | 7/2003 | Stephens | H01S 3/302 356/72 |
| 7,129,722 B1 | | 10/2006 | Brophy et al. | |
| 2003/0030005 A1 | * | 2/2003 | Karki | G01N 33/343 250/373 |
| 2003/0189440 A1 | | 10/2003 | Barror | |
| 2004/0042750 A1 | * | 3/2004 | Gillberg | G02B 6/02395 385/128 |
| 2004/0052522 A1 | * | 3/2004 | Fishteyn | H04B 10/07951 398/29 |
| 2004/0062465 A1 | * | 4/2004 | Woodley | G02B 6/122 385/2 |
| 2004/0174517 A1 | * | 9/2004 | Brendel | G01M 11/336 356/73.1 |
| 2006/0109015 A1 | | 5/2006 | Thacker et al. | |
| 2007/0183780 A1 | * | 8/2007 | Tyler | G01J 3/32 398/85 |
| 2009/0175623 A1 | * | 7/2009 | Park | H04B 10/675 398/79 |
| 2009/0268198 A1 | * | 10/2009 | Brendel | G01M 11/336 356/73.1 |
| 2010/0254789 A1 | | 10/2010 | Murnauer | |
| 2011/0279109 A1 | | 11/2011 | Masuda | |
| 2012/0033208 A1 | * | 2/2012 | Hara | G02B 6/4292 356/244 |
| 2012/0043984 A1 | | 2/2012 | Yashar et al. | |
| 2013/0230272 A1 | | 9/2013 | Raj et al. | |
| 2014/0314427 A1 | * | 10/2014 | Ojima | H04B 10/6163 398/194 |
| 2015/0168486 A1 | * | 6/2015 | Isaac | G01R 31/2834 324/756.02 |

FOREIGN PATENT DOCUMENTS

| | | |
|---|---|---|
| WO | WO 2010/050985 | 5/2010 |
| WO | WO 2015/094177 | 6/2015 |

OTHER PUBLICATIONS

First Office Action for Chinese Application No. 201610154657.2, dated May 24, 2018, 10 pages.

Extended European Search Report for European Patent Application No. 20181252.6, dated Nov. 11, 2020, 5 pages.

* cited by examiner

METHODS AND APPARATUS FOR OPTICAL TRANSCEIVER CALIBRATION AND TEST

CROSS-REFERENCE TO RELATED PATENT APPLICATIONS

This application is a continuation of U.S. patent application Ser. No. 14/829,536, now U.S. Pat. No. 10,031,177, filed on Aug. 18, 2015, and entitled "Methods and Apparatus for Optical Transceiver Calibration and Test," the disclosure of which is incorporated herein by reference in its entirety.

BACKGROUND

Some embodiments described herein relate generally to methods and apparatus for calibrating and testing optical transceivers. In particular, but not by way of limitation, some embodiments described herein relate to methods and apparatus for calibrating and testing optical transceivers using automatic integrated circuit (IC) handlers.

Optical transceivers, which are used within optical network systems, transmit and receive data by converting electrical signals to optical signals, and optical signals to electrical signals. To guarantee compliance to specifications and industry standards, calibrating and testing of the electrical and optical parameters of an optical transceiver is a part of a manufacturing process. Thus, a need exists for a specialized test equipment to calibrate and test optical transceivers.

IC handlers have been developed to test integrated circuits using Automated Test Equipment (ATE). These IC handlers often include a change kit to adapt to different sizes of ICs. Such IC handlers, however, are not compatible with testing optical transceivers due to the lack of optical response mechanisms.

Accordingly, a need exists for improved methods and apparatus to calibrate and test optical transceivers.

SUMMARY

In some embodiments, an apparatus includes an automatic integrated circuit (IC) handler having a change kit. The change kit has a plunger moveably disposable onto an automatic test equipment (ATE). In such embodiments, the ATE is configured to receive an integrated circuit having an optical interface. The plunger has a first position and a second position. In such embodiments, the plunger is out of contact with the integrated circuit when the plunger is in the first position. The plunger includes an optical connector operatively coupled to the optical interface of the integrated circuit when the plunger is in the second position.

DETAILED DESCRIPTION

In some embodiments, an apparatus includes an automatic integrated circuit (IC) handler having a change kit. The change kit has a plunger moveably disposable onto an automatic test equipment (ATE). In such embodiments, the ATE is configured to receive an integrated circuit having an optical interface. The plunger has a first position and a second position. In such embodiments, the plunger is out of contact with the integrated circuit when the plunger is in the first position. The plunger includes an optical connector operatively coupled to the optical interface of the integrated circuit when the plunger is in the second position.

In some embodiments, an apparatus includes an automatic integrated circuit (IC) handler having a change kit. The change kit includes a plunger moveably disposable with an automatic test equipment (ATE). The ATE includes a stop and a load board. The load board and the stop are collectively configured to receive, on the load board and within the stop, an integrated circuit having an optical interface. In such embodiments, the plunger has an optical connector and an electrical connector. The optical connector of the plunger is configured to be operatively coupled to the integrated circuit. The electrical connector of the plunger is configured to be operatively coupled to at least one of the integrated circuit or the load board.

In some embodiments, an apparatus includes an automatic integrated circuit (IC) handler configured to test an integrated circuit having an optical interface and an optical fiber coupled to the optical interface when the automatic IC handler is operatively coupled to an automatic test equipment (ATE). The automatic IC handler has an optical connector configured to be operatively coupled to the integrated circuit. In such embodiments, the automatic IC handler has at least one optical filter and at least one optical detector. The at least one optical filter is uniquely associated with at least one wavelength for the optical fiber. The at least one optical detector is uniquely associated with at least one channel for the optical fiber. The at least one wavelength is uniquely associated with the at least one channel.

As used in this specification, the singular forms "a," "an" and "the" include plural referents unless the context clearly dictates otherwise. Thus, for example, the term "an optical detector" is intended to mean a single optical detector or a combination of optical detectors.

Figure 1:
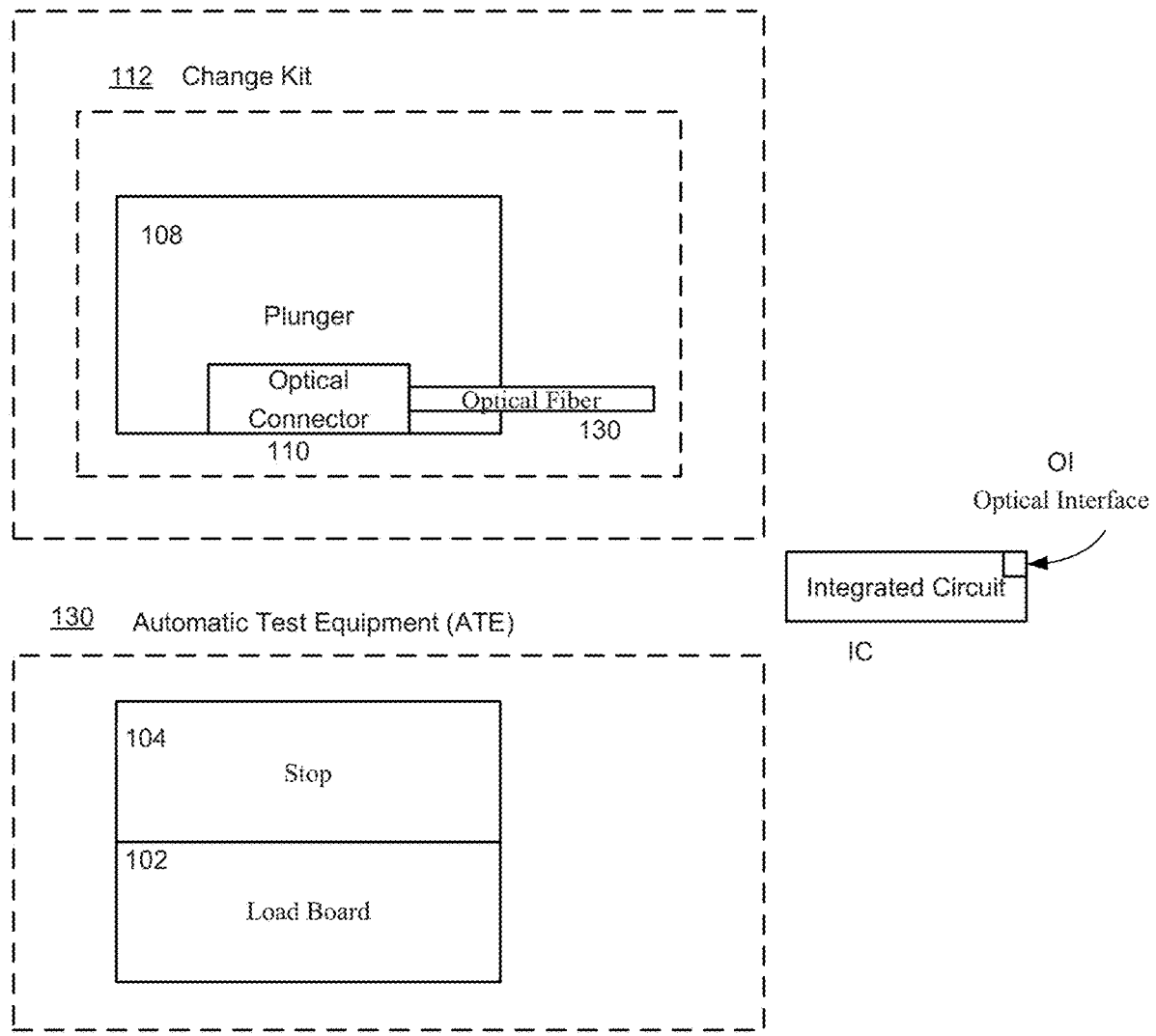
FIG. 1 is a block diagram of an automatic IC handler 100, according to an embodiment.

FIG. 1 is a block diagram of an automatic IC handler 100, according to an embodiment. The automatic IC handler 100 when operatively coupled with an Automatic Test Equipment (ATE) 130 can calibrate and test integrated circuits (ICs). More specifically, the automatic IC handler 100 when operatively coupled with an ATE 130 can calibrate and test optical transceiver integrated circuits. The optical transceiver integrated circuit (IC) includes an optical interface (01).

As shown in FIG. 1, the automatic IC handler 100 includes a change kit 112. The automatic IC handler 100 can be operatively coupled to an Automatic Test Equipment (ATE) system 130. The change kit 112 includes a plunger 108. The plunger 108 can be operatively coupled to a set of optical components (not shown in FIG. 1) used to calibrate and test the optical transceiver integrated circuits. The ATE 130 includes a stop and/or socket 104 and a load board 102. The stop/socket 104 can be removably coupled to the load board 102. The load board 102 and the stop/socket 104 can be configured to collectively receive, on the load board 102 and within the stop/socket 104, the IC. The stop/socket 104 limits movement of the IC in the x-y plane (or substantially the same plane of the load board 102 and the stop/socket 104), but also limits the movement of the plunger 108 in the z direction (or the direction substantially perpendicular to the plane of the load board 102 and the stop/socket 104) to allow coupling to but prevent damage of the IC. In some implementations, the stop 104 can be a socket (or receptacle) such that the movement of the IC is limited by the sides of the socket (or receptacle). In some embodiments, the automatic IC handler 100 can be configured to calibrate and test ICs in different sizes. In such embodiments, a stop/socket 104 with a size (inner perimeter and height) that substantially matches the size (outer perimeter and height) of the ICs can be disposed on the load board 102. Thus, the load board 102 and the stop/socket 104 with a size that substantially matches the size of the IC can be configured to collectively receive, on the load board and within the stop/socket, the IC.

The plunger 108 includes an optical connector 110 operatively coupled to an optical fiber 130. The plunger 108 is moveably disposed within the change kit 112. The plunger 108 can move from a first position where the plunger 108 is out of contact with the IC, to a second position where the plunger 108 is operatively coupled to the IC. At the second position, the plunger 108 and the IC are operatively coupled to each other optically and electronically to enable communications of optical signals and electronic signals. Specifically, the optical connector 110 of the plunger 108 is operatively coupled to an optical interface of the IC when the plunger 108 is at the second position. To enable transmissions of electronic signals, the plunger 108 has an electrical connector (not shown in the figure) operatively coupled to the IC through the load board when the plunger 108 is at the second position. The electrical connector of the plunger 108 is also coupled to the load board 102 via a plurality of pogo pins or a change kit harness. In some instances, the change kit harness is a bundle of wires that can transmit electronic signals.

In other words, when the automatic IC handler 100 is not being used, the plunger 108 can be configured to be at the first position. When the automatic IC handler 100 is ready to calibrate and test the IC disposed within the stop/socket 104 and onto the load board 102, the plunger 108 can be configured to move from the first position toward the IC to the second position where an optical connection and an electrical connection can be configured to be established between the plunger 108 and the IC. To establish optical connections, the optical connector 110 of the plunger 108 is operatively coupled to the optical interface of the IC. To establish electrical connections, an electrical connector (not shown in the figure) of the plunger 108 can be configured to be operatively coupled to the IC. The electrical connector of the plunger 108 can also be configured to be coupled to the load board 102 via a plurality of pogo pins or a change kit harness.

In some embodiments, the optical connector of the plunger 108 and the optical interface of the IC can be aligned through an alignment mechanism to facilitate the optical coupling between the plunger 108 and the IC when the plunger 108 moves from the first position to the second position. For example, the plunger 108 can have an alignment feature (or pin) that aligns with an alignment receptacle (or hole) on the IC. Alternatively, the plunger 108 can have an alignment receptacle (or hole) that aligns with an alignment feature (or pin) on the IC.

The automatic IC handler 100 includes at least one optical filter (not shown in FIG. 1) operatively coupled to at least one optical detector (not shown in FIG. 1). The optical filter selectively passes light in a particular range of wavelengths. The optical detector can be, for example, a photomultiplier tube (PMT), a charge coupled device (CCD) camera, a photodiode detector, a pixel array detector, and/or the like.

The at least one optical filter is associated with at least one wavelength for the optical interface of the IC. The at least one optical detector is uniquely associated with at least one channel for the optical interface. The at least one wavelength is uniquely associated with the at least one channel. The at least one optical filter and the at least one optical detector are operatively coupled to the optical connector 110 of the plunger 108. Using the optical filter(s), the automatic IC handler 100 can test the wavelength(s) of the channel(s) of the IC. Using the optical detector(s), the automatic IC handler 100 can test an optical power of the channel(s) of the IC.

In some implementations, the automatic IC handler 100 includes a set of optical filters (not shown in FIG. 1) operatively coupled to a set of optical detectors (not shown in FIG. 1). Each optical filter from the set of optical filters is uniquely associated with one wavelength from a set of wavelengths for the optical interface of the IC. Each optical detector is uniquely associated with one channel from a set of channels for the optical interface. Each wavelength is uniquely associated with one channel from the set of channels for the optical interface.

The optical filter(s) and the optical detector(s) are operatively coupled to the optical interface of the IC, through the optical connector 110 of the plunger 108, when the plunger 108 is at the second position.

In the circumstances where a large number of optical transceiver ICs with the same size (or substantially the same size) are to be tested, an automatic IC handler (such as the automatic IC handler 100 in FIG. 1) can be deployed such that the calibrating and testing of these optical transceiver ICs can be achieved for efficient and economical purposes. When a number of optical transceiver ICs with a different size (or substantially different size) are to be tested, only the change kit included within the optical IC handler (such as the change kit 112 in FIG. 1) is to be switched to a newly compatible size, therefore, making the calibrating and testing of optical transceiver ICs automatic, efficient, and economical.

Figure 2:
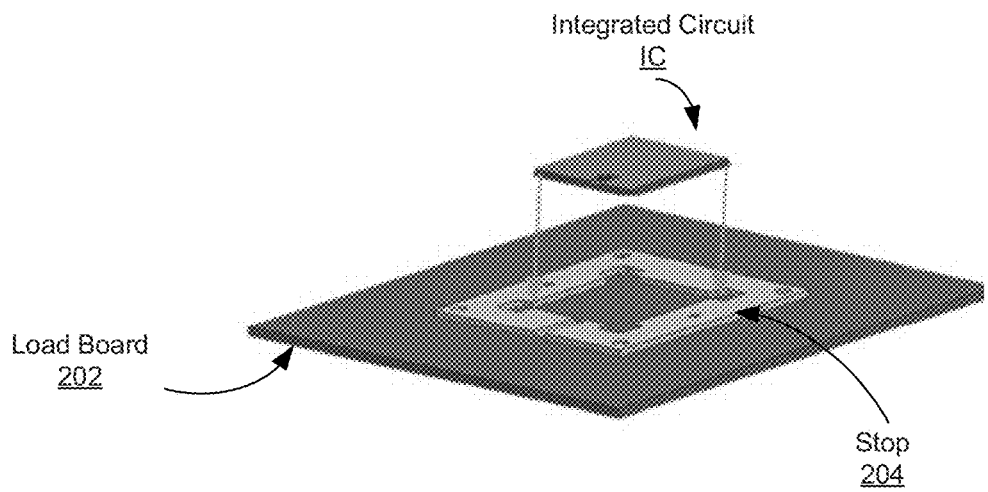
FIGS. 2-3 are diagrams of a change kit and an automatic test equipment (ATE), according to an embodiment.
Figure 3:
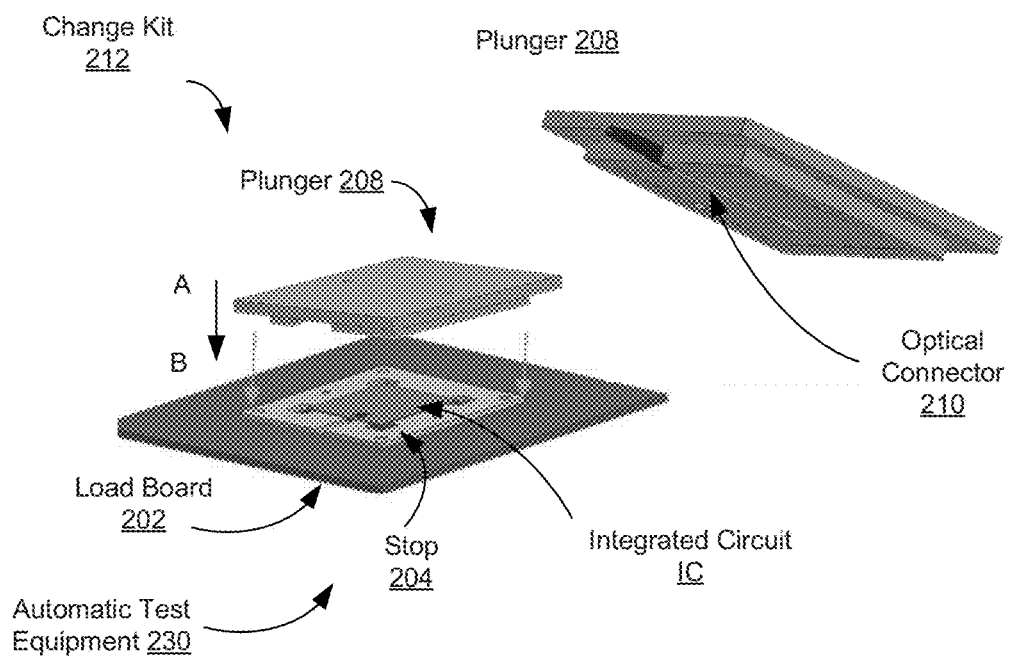

FIGS. 2-3 are diagrams of a change kit 212 and an automatic test equipment (ATE) 230, according to an embodiment. The plunger 208 is included in a change kit 212 which is included in an automatic IC handler (not shown in FIGS. 2-3) similar to the automatic IC handler 100 described in FIG. 1. The automatic IC handler can be operatively coupled with an ATE 230, which includes a stop/socket 204 and a load board 202. The stop/socket 204 is a removable component and can be coupled to the load board 202. The load board 202 and the stop/socket 204 can be configured to collectively receive the IC on the load board 202 and within the stop/socket 204. In some embodiments, the automatic IC handler can be configured to calibrate and test ICs in different sizes. In such instances, a stop/socket 204 with a size (inner perimeter and height) that substantially matches the size (outer perimeter and height) of the ICs can be disposed on the load board 202. Thus, the load board 202 and the stop/socket 204 with a size that substantially matches the size of the IC can be configured to collectively receive the IC on the load board and within the stop/socket.

The plunger 208 includes an optical connector 210 operatively coupled to an optical fiber (not shown in FIGS. 2-3). The plunger 208 can move toward the IC from a first position (position A) to a second position (position B). In other words, the plunger 208 can be configured to move from a first position (position A) where the plunger is out of contact with the IC, to a second position (position B) where the plunger 208 is operatively coupled to the IC. At the second position (position B), the plunger 208 and the IC are operatively coupled to each other optically and electronically to enable transmissions of optical signals and electronic signals. Specifically, the optical connector 210 of the plunger 208 is operatively coupled to an optical interface of the IC when the plunger 208 is at the second position. To enable transmissions of electronic signals, the plunger 208 has an electrical connector (not shown in the figure) operatively coupled to the IC when the plunger 208 is at the second position. The electrical connector of the plunger 208 is also coupled to the load board 202 via a plurality of pogo pins or a change kit harness. In some instances, the change kit harness is a bundle of wires that can transmit electronic signals.

In other words, when the automatic IC handler is not being used, the plunger 208 can be configured to be at the first position. When the automatic IC handler is ready to calibrate and test the IC disposed within the stop/socket 204 and onto the load board 202, the plunger 208 can be configured to move from the first position toward the IC to the second position where an optical connection and an electrical connection can be configured to be established between the plunger 208 and the IC. To establish optical connections, the optical connector 210 of the plunger 208 is operatively coupled to the optical interface of the IC. To establish electrical connections, an electrical connector (not shown in the figure) of the plunger 208 can be configured to be operatively coupled to the IC. The electrical connector of the plunger 208 can also be configured to be coupled to the load board 202 via a plurality of pogo pins or a change kit harness.

Figure 4:
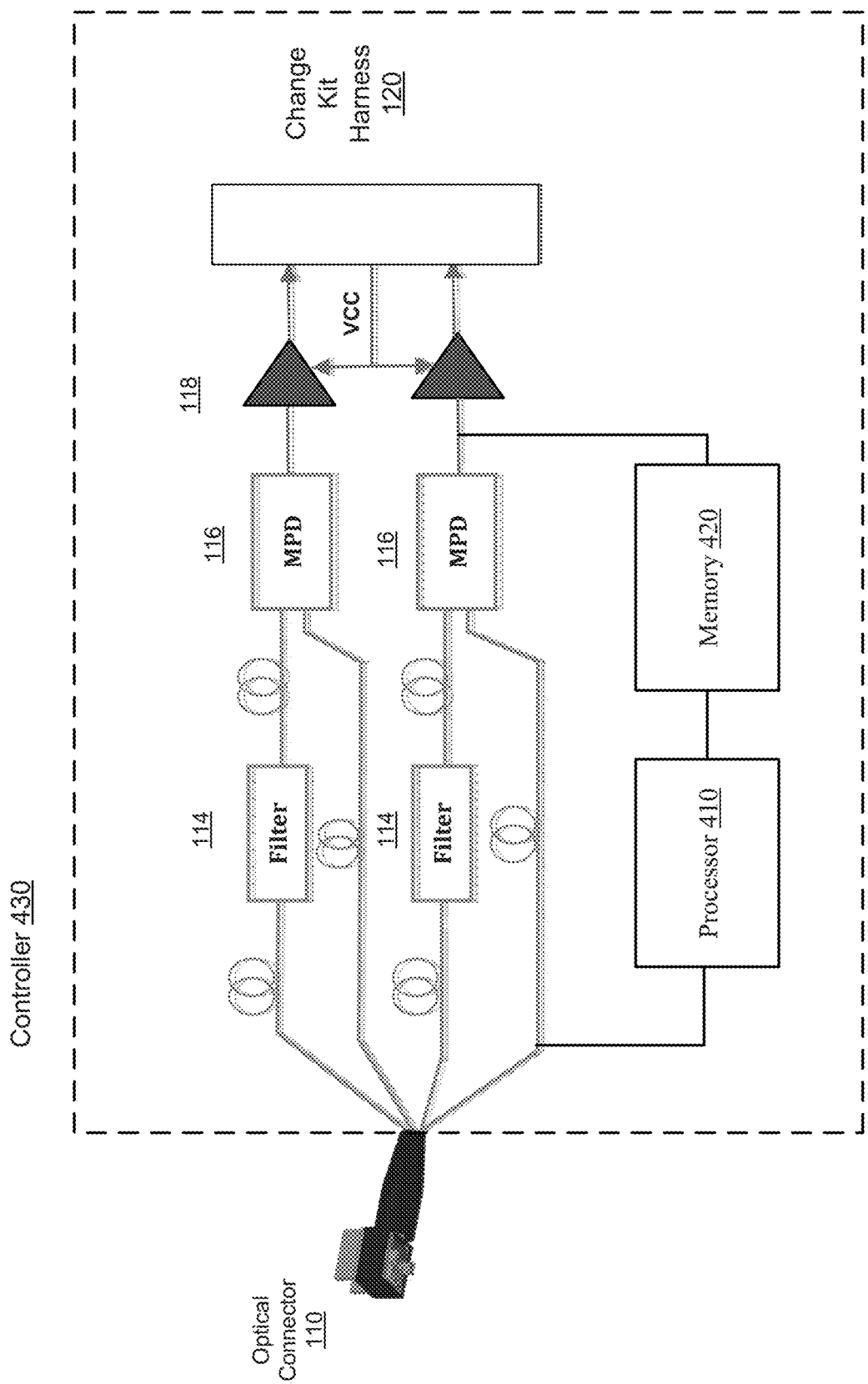
FIG. 4 is a block diagram illustrating a controller in an automatic IC handler, according to an embodiment.

FIG. 4 is a block diagram illustrating a controller 430 in an automatic IC handler, according to an embodiment. In some embodiments, an optical connector 110 of a plunger (such as the plunger 108 described in FIG. 1) in an automatic IC handler (such as the automatic IC handler 100 described in FIG. 1) can be operatively coupled to a controller 430 configured to produce control signals (optical and/or electrical) to an IC (such as the IC in FIG. 1) during a calibration and testing process of the IC. In some instances, the controller 430 (also referred herein to as "calibration kit") is an optical device disposed within a metal box attached to the plunger. In some implementations, the optical connector 110 of the plunger can "float" on the bottom of the plunger and aligns to at least one of the IC or the load board (such as the load board 102 in FIG. 1) using one or more alignment posts in the optical connector 110.

In some embodiments, the controller 430 includes a processor 410, a memory 420, at least one optical filter 114 operatively coupled to at least one optical detector, such as a monitor photodiode (MPD) 116. The optical filter 114 and the optical detector 116 are included in the controller 430 and can operatively couple to the IC. The output of the controller 430 produces control signals to the IC. In other embodiments, the controller 430 does not include a processor 410 or a memory 420. The functions of the processor 410 and the memory 420 described herein can be implemented in the optical transceiver IC or the ATE (such as the ATE 130 described in FIG. 1 or the ATE 230 in FIG. 3).

The MPD 116 can be operatively coupled to at least one operational amplifier 118 with an input voltage (VCC) applied to the operational amplifier 118. The input voltage (VCC) is also applied to the IC via a change kit harness 120 or via a plurality of pogo pins. In some instances, the MPD 116 can be operatively coupled to a load board (such as the load board 102 described in FIG. 1) or an IC (such as the IC described in FIGS. 1-4) through a set of pogo pins (not shown in FIG. 4). In other instances, the MPD 116 can be operatively coupled to a load board (such as the load board 102 described in FIG. 1) or an IC (such as the IC in FIG. 1) through the change kit harness 120. The detected signals (output from MPD 116) are input into the operational amplifier 118. The output from the operational amplifier 118 is control signal input to the IC such that the IC can operate in a desired way for calibration and testing.

The at least one optical filter 114 is associated with at least one wavelength for the optical interface of the IC. The at least one optical detector 116 is uniquely associated with at least one channel for the optical interface. The at least one wavelength is uniquely associated with the at least one channel. The at least one optical filter and the at least one optical detector can be operatively coupled to the optical connector 110 of the plunger 108 when the plunger 108 is at the second position. Using the at least one optical filter 114, the automatic IC handler 100 can be configured to test the at least one wavelength of at least one channel of the IC. Using the at least one optical detector 116, the automatic IC handler 100 can be configured to test an optical power of the at least one channel of the IC.

In some implementations, the automatic IC handler includes a set of optical filters 114 operatively coupled to a set of optical detectors 116. Each optical filter from the set of optical filters 114 is uniquely associated with one wavelength from a set of wavelengths for the optical interface of the IC. Each optical detector from the set of optical detectors 116 is uniquely associated with one channel from a set of channels for the optical interface. Each wavelength is uniquely associated with one channel from the set of channels for the optical interface.

The memory 420 can be, for example, a random-access memory (RAM) (e.g., a dynamic RAM, a static RAM), a flash memory, a removable memory, a hard drive, a database and/or so forth. In some implementations, the memory 420 can include, for example, a database, process, application, virtual machine, and/or some other software modules (stored and/or executing in hardware) or hardware modules configured to execute an IC calibration and testing process and/or one or more associated methods for IC calibration and testing. In such embodiments, instructions of executing the IC calibration and testing process and/or the associated methods can be stored within the memory 420 and executed at the processor 410.

The processor 410 can be configured to control, for example, write data into and read data from the memory 420, and execute the instructions stored within the memory 420. The processor 410 can also be configured to execute and/or control, for example, the operations of the optical filter 114, and/or the MPD 116. In some implementations, based on the methods or processes stored within the memory 420, the processor 410 can be configured to execute an optical receiver IC calibration and testing process, as described in FIG. 5.

Figure 5:
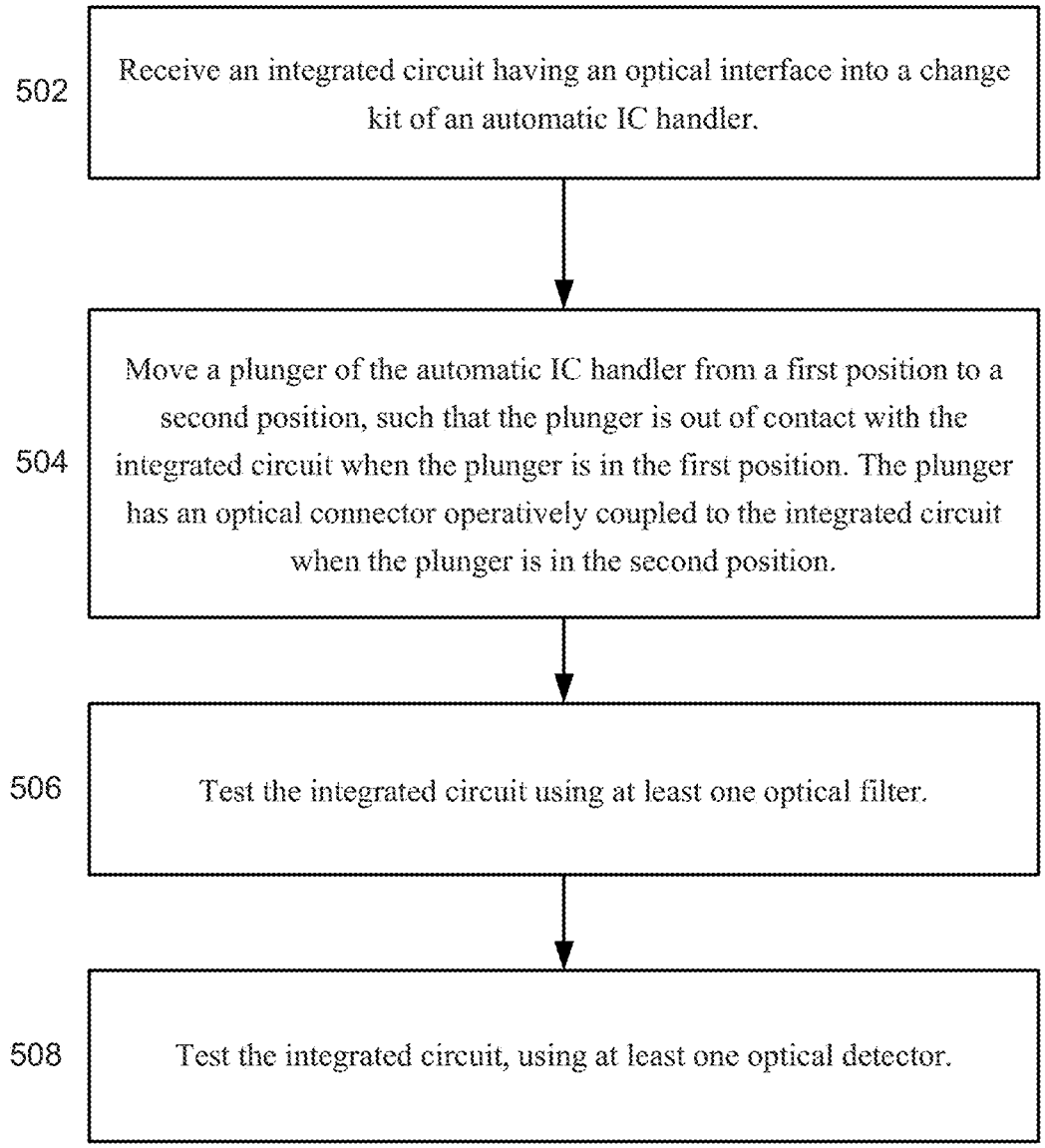
FIG. 5 is a flow chart illustrating a method of calibrating and testing an integrated circuit using an automatic IC handler, according to an embodiment.

FIG. 5 is a flow chart illustrating a method 500 of calibrating and testing an integrated circuit using an automatic IC handler, according to an embodiment. The IC calibrating and testing method 500 can be executed at, for example, a controller such as the controller 430 shown and described with respect to FIG. 4. In other embodiments, the IC calibrating and testing method 500 can be executed at, for example, the IC. The method 500 includes receiving an integrated circuit having an optical interface into a change kit of an automatic IC handler at 502. As described above, the automatic IC handler can be configured to calibrate and test ICs. In some embodiments, the ICs are optical transceiver ICs. The automatic IC handler includes a change kit having a plunger. The automatic IC handler can be operatively coupled to an automatic test equipment (ATE) which includes a stop/socket and a load board. The load board and the stop/socket collectively receive an IC. The change kit facilities the calibrating and testing of the ICs in different sizes. In such embodiments, a stop with a size (inner perimeter and height) that substantially matches the size (outer perimeter and height) of the ICs can be disposed on the load board.

At 504, the plunger of the automatic IC handler is moved from a first position to a second position, such that the plunger is out of contact with the integrated circuit when the plunger is in the first position. The plunger has an optical connector operatively coupled to the integrated circuit when the plunger is in the second position.

At 506 and 508, the integrated circuit is tested using at least one optical filter and at least one optical detector. As discussed above, the at least one optical filter is associated with at least one wavelength for the optical interface of the IC. The at least one optical detector is uniquely associated with at least one channel for the optical interface. The at least one wavelength is uniquely associated with the at least one channel. The at least one optical filter and the at least one optical detector can be operatively coupled to the optical connector of the plunger when the plunger is at the second position. Using the at least one optical filter, at least one wavelength of at least one channel of the IC is tested. Using the at least one optical detector, an optical power of the at least one channel of the IC is tested.

It is intended that the systems and methods described herein can be performed by software (stored in memory and/or executed on hardware), hardware, or a combination thereof. Hardware modules may include, for example, a general-purpose processor, a field programmable gate array (FPGA), and/or an application specific integrated circuit (ASIC). Software modules (executed on hardware) can be expressed in a variety of software languages (e.g., computer code), including Unix utilities, C, C++, Java™, JavaScript (e.g., ECMAScript 6), Ruby, SQL, SAS®, the R programming language/software environment, Visual Basic™, and other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. Additional examples of computer code include, but are not limited to, control signals, encrypted code, and compressed code.

Some embodiments described herein relate to devices with a non-transitory computer-readable medium (also can be referred to as a non-transitory processor-readable medium or memory) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to: magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

While various embodiments have been described above, it should be understood that they have been presented by way of example only, and not limitation. Where methods and steps described above indicate certain events occurring in certain order, the ordering of certain steps may be modified. Additionally, certain of the steps may be performed concurrently in a parallel process when possible, as well as performed sequentially as described above. Although various embodiments have been described as having particular features and/or combinations of components, other embodiments are possible having any combination or sub-combination of any features and/or components from any of the embodiments described herein. Furthermore, although various embodiments are described as having a particular entity associated with a particular compute device, in other embodiments different entities can be associated with other and/or different compute devices.

What is claimed is:

1. An apparatus, comprising:
an automatic integrated circuit (IC) handler having a first change kit, the first change kit having a plunger with an optical connector, the plunger configured to be moveable between a first position and a second position and moveably disposable onto an Automatic Test Equipment (ATE) that received a first integrated circuit having an optical interface,
(1) the plunger configured to be out of contact with the first integrated circuit when the plunger is in the first position,
(2) the plunger configured to be operatively coupled, via the optical connector of the plunger, to the optical interface of the first integrated circuit in response to the plunger moving from the first position and stopping at the second position, and
(3) the first integrated circuit being in contact with the ATE and not moveable with the plunger when the plunger moves between the first position and the second position;
the automatic IC handler configured to have a second change kit, different from the first change kit, to test optical and electrical properties of a second integrated circuit received by the ATE and having a size different from a size of the first integrated circuit.

2. The apparatus of claim 1, wherein the first integrated circuit is an optical transceiver integrated circuit.

3. The apparatus of claim 1, wherein:
when operatively coupled with the ATE, the automatic IC handler is configured to test, using at least one optical filter, at least one wavelength of an optical fiber of the first integrated circuit.

4. The apparatus of claim 1, wherein:
when operatively coupled with the ATE, the automatic IC handler is configured to test, using at least one optical detector, an optical power of an optical fiber of the first integrated circuit.

5. The apparatus of claim 1, wherein:
the plunger has an electrical connector configured to be operatively coupled to the first integrated circuit.

6. The apparatus of claim 1, wherein:
the ATE includes a load board configured to receive, on the load board, the first integrated circuit, and
the plunger is configured to be electrically coupled to the load board via a plurality of pogo pins or a change kit harness of the automatic IC handler.

7. The apparatus of claim 1, wherein:
one of the plunger or the first integrated circuit includes an optical fiber receptacle that aligns with an alignment pin of the other of plunger or the first integrated circuit when the plunger is in the second position.

8. The apparatus of claim 1, wherein:
the automatic IC handler includes at least one optical filter coupled to at least one optical detector, the at least one optical filter configured to be operatively coupled to the optical connector of the plunger, the at least one optical filter being uniquely associated with at least one wavelength for an optical fiber of the first integrated circuit, the at least one optical detector being uniquely associated with at least one channel for the optical fiber of the first integrated circuit, the at least one wavelength being uniquely associated with the at least one channel.

9. The apparatus of claim 1, wherein:
when the plunger is in the second position,
the plunger is electrically coupled to the ATE via an electrical connector of the plunger.

10. A method, comprising:
receiving, at an Automatic Test Equipment (ATE), a first integrated circuit having an optical interface when a plunger of a first change kit of an automatic integrated circuit (IC) handler is out of contact with the first integrated circuit at a first position;
testing, using an optical filter of the automatic IC handler and when the plunger is in contact with the first integrated circuit at a second position, at least one wavelength of an optical fiber of the first integrated circuit, the plunger optically coupled to the optical interface of the first integrated circuit in response to the plunger moving from the first position and stopping at the second position;
testing, using an optical detector of the automatic IC handler and when the plunger is at the second position, an optical power of the optical fiber of the first integrated circuit;
receiving, at the ATE, a second integrated circuit having a size different from a size of the first integrated circuit;
testing at least one wavelength of an optical fiber of the second integrated circuit; and
testing, using the automatic IC handler with a second change kit different from the first change kit, an optical power of the optical fiber of the second integrated circuit.

11. The method of claim 10, wherein:
the plunger includes an optical connector configured to be operatively coupled to the optical interface of the first integrated circuit;
the plunger includes an electrical connector configured to be operatively coupled to at least one of the first integrated circuit or the ATE.

12. The method of claim 10, wherein:
the ATE includes a load board and a stop, the stop removably coupled to the load board,
the receiving the first integrated circuit includes receiving, on the load board and within the stop, the first integrated circuit having the optical interface.

13. The method of claim 10, wherein the plunger is moveable between a first position and a second position.

14. An apparatus, comprising:
an automatic integrated circuit (IC) handler having a first change kit having a plunger moveably disposable with an automatic test equipment (ATE),
the ATE configured to receive a first integrated circuit having a first optical interface,
the plunger having an optical connector and an electrical connector, the optical connector of the plunger configured to be operatively coupled to the first optical interface of the first integrated circuit, the electrical connector of the plunger configured to be operatively coupled to at least one of the first integrated circuit or the ATE,
the automatic IC handler configured to test at least one wavelength of a first optical fiber of the first integrated circuit,
the ATE configured to receive a second integrated circuit having a second optical interface, the second integrated circuit having a second size different from a first size of the first integrated circuit,
the automatic IC handler having a second change kit different from the first change kit and configured to test at least one wavelength of a second optical fiber of the second integrated circuit.

15. The apparatus of claim 14, wherein:
the automatic IC handler includes at least one optical detector,
the automatic IC handler is configured to test, using the at least one optical detector, an optical power of the first optical fiber of the first integrated circuit and an optical power of the second optical fiber of the second integrated circuit.

16. The apparatus of claim 14 wherein the first integrated circuit is an optical transceiver integrated circuit.

17. The apparatus of claim 14, wherein the plunger is configured to be electrically coupled to the ATE via a plurality of pogo pins or a change kit harness of the automatic IC handler.

18. The apparatus of claim 14, wherein:
one of the plunger or the first integrated circuit includes an optical fiber receptacle that is configured to align with an alignment pin of the other of plunger or the first integrated circuit.

* * * * *